Feb. 9, 1971 R. E. BLEVINS 3,562,020

SOLAR CELL ASSEMBLY

Filed May 31, 1966 2 Sheets-Sheet 1

Ronald E. Blevins,
INVENTOR
BY.
Jerry A. Dinardo
AGENT.

United States Patent Office 3,562,020

Patented Feb. 9, 1971

3,562,020

SOLAR CELL ASSEMBLY

Ronald E. Blevins, Torrance, Calif., assignor to TRW Inc., Redondo Beach, Calif., a corporation of Ohio Filed May 31, 1966, Ser. No. 553,969

Int. Cl. H01l *15/02*

U.S. Cl. 136—89 6 Claims

ABSTRACT OF THE DISCLOSURE

A solar cell assembly which comprises a substrate, and a grid of electrically insulating material adhesively joined to a surface of the substrate. The grid is formed with an array of openings therein which are shaped to accommodate one or more solar cells along the lateral extent of each opening. Thus, according to one aspect of the invention, the grid serves as a jig for locating and assembling a multiplicity of solar cells in a desired array.

The solar cells are arranged within the openings so as to substantially fill the lateral extent of the openings, and are adhesively joined to the substrate surface. Means are provided for electrically connecting at least a plurality of the solar cells in circuit with each other.

This invention relates to solar cell assemblies, and more particularly to improvements which reduce the manufacturing time and cost of solar cell arrays.

BACKGROUND OF THE INVENTION

According to the prior art, solar cells are assembled into arrays or panels through the use of relatively high precision and massive jigs and tooling fixtures. The high precision required for the jigs, and the fact that a different jig is required for a different array, results in a relatively high cost of manufacture.

The usual manufacturing procedure includes the step of heating the jig and the assembled solar cells to a temperature at which the solar cells can be soldered to interconnecting and substrate members. Because of the considerable heating time required to heat the relatively massive jig to the soldering temperature, the solar cells tend to degrade in their efficiency. Furthermore, long manufacturing times result in added cost of manufacture.

During the soldering process, the solar cells are subjected to light bonding pressures by means of individual springs which spring press together the cells and the interconnecting and base members. Because of the difficulty in achieving uniformity in the bonding pressures, some of the solar cells invariably fracture. The detection, removal, and replacement of the fractured cells also adds to the manufacturing cost.

The assembly of solar cell arrays according to the invention provides the following advantages. In the first place, expensive jigs are dispensed with. Secondly, soldering time is reduced to less than one-half. Because of the reduced soldering time, the degradation of solar cells due to excessive heating time is eliminated. Thirdly, more uniform bonding pressures are realized and solar cell fractures are virtually eliminated. In addition, the invention provides a ready means for economically assembling the solar cells in different patterns and in large size arrays.

Figures 1, 2, 9:
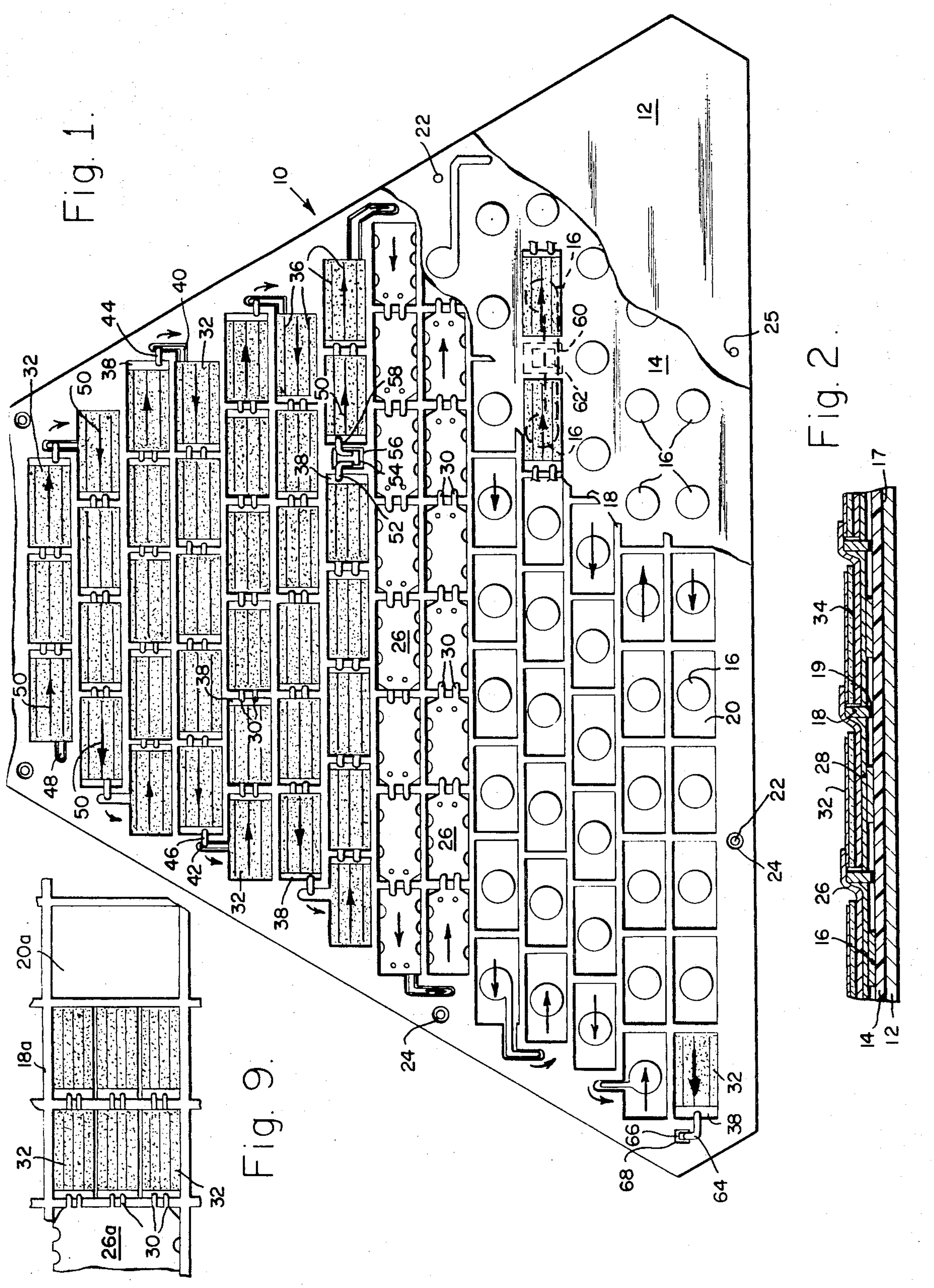
FIG. 1 is a full scale plan view, with portions removed, of a solar cell assembly arranged according to the invention.
FIG. 2 is a fragmentary section, slightly enlarged, of the solar cell assembly of FIG. 1.
FIG. 9 is a fragmentary plan view of a modified form of solar cell assembly according to the invention.

Referring to FIGS. 1 and 2, there is shown a solar cell assembly 10 in the form of a layered structure including a substantially rigid mounting plate 12, and an electrically insulating sheet 14 bonded on one side to the mounting plate 12 and provided on its other side with an etched pattern of electrically conductive areas or circular dots 16. The plate 12 and sheet 14 integrally united constitute a substrate for supporting an array of solar cells.

While the supporting substrate may be made of a single insulating layer, such as a board of epoxy, fiberglass, or phenolic resin, made of the same material as the electrical insulating sheet 14, it is preferred to form the substrate from two layers, as shown, in applications where problems of heat dissipation arise. Thus, in such applications the mounting plate is preferably made of a light-weight metal, such as aluminum, which acts as a heat dissipating element without adding too much weight to the structure. The plate 12 and insulating sheet 14 may be united by epoxy cement 17, as shown in FIG. 2. The pattern of dots 16 may be formed of copper by conventional etched circuit techniques, after which a thin coating of tin solder may be applied to the dots 16.

The solar cell assembly 10 also includes a grid 18 of electrical insulation material bonded to the insulating sheet 14, as by means of epoxy cement 19. The openings 20 of the grid 18 are registered with the conductive dots 16. The grid openings 20 are rectangular in shape to accommodate the array of solar cells.

Figures 3, 4, 8:
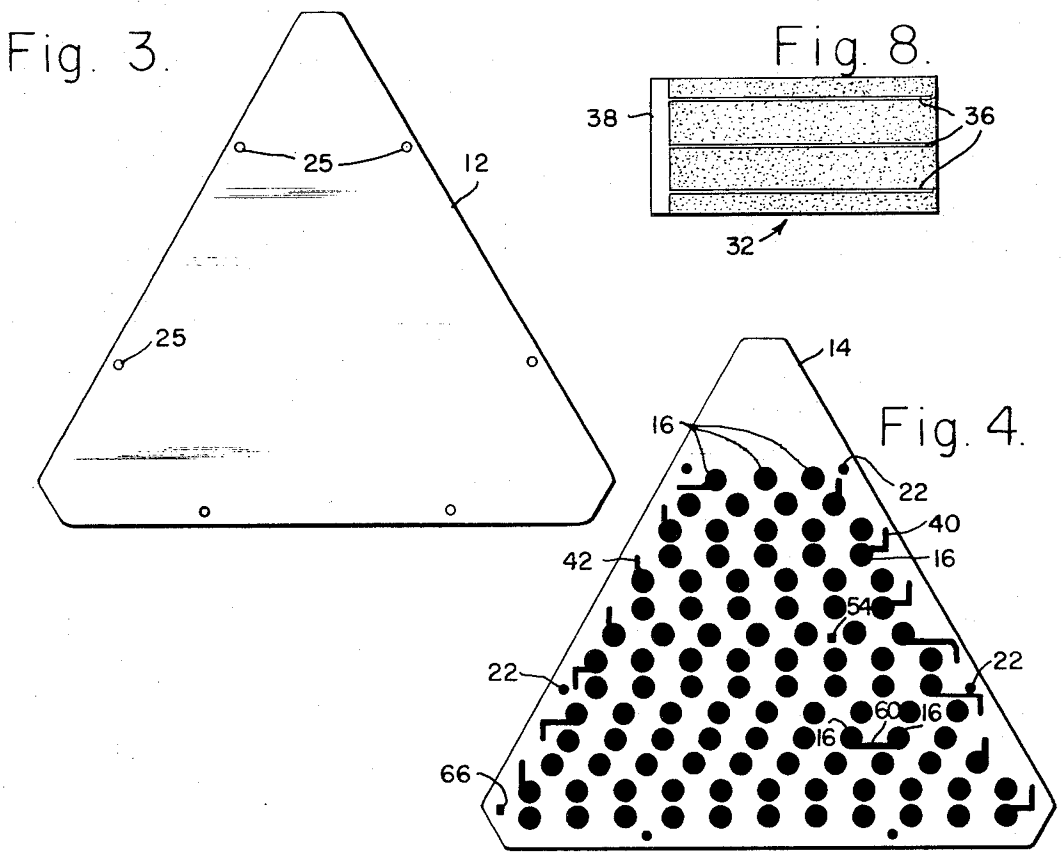
FIG. 3 is a plan view, reduced in size, of a mounting plate forming a part of the assembly of FIG. 1.
FIG. 4 is a plan view, reduced in size, of an insulating sheet and conductive dot assembly forming another part of the assembly of FIG. 1.
FIG. 8 is an enlarged plan view of a solar cell forming a part of the assembly of FIG. 1.
Figure 5:
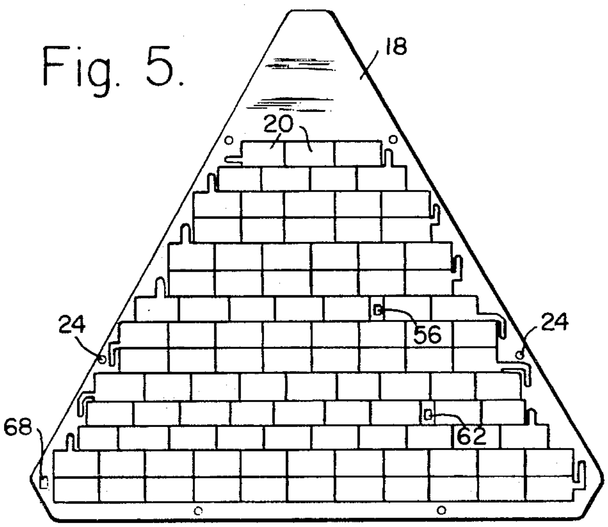
FIG. 5 is a plan view, reduced in size, of a grid forming another part of the assembly of FIG. 1.

The mounting plate 12, insulating sheet 14, and grid 18 are shown in more detail in FIGS. 3, 4, and 5 respectively. For registering the dots 16 with the grid openings 20, a number of small registering dots 22 are provided near the outer extremities of the insulating sheet 14 which can be located within corresponding small registering holes 24 in the grid 18.

After the solar cell assembly 10 is complete, the insulating sheet 14 can be drilled or punched through the registering dots 22 to permit the insertion of bolts or other fasteners through the registering holes 24 and corresponding holes 25 in the mounting plate 12, for attaching the solar cell assembly 10 to a satellite structure or other utilization device.

The grid 18 may be made from a sheet of epoxy, fiberglass, or phenolic resin, with the openings 20 therein produced by photoetching techniques. Briefly, this photoetching process consists of applying copper layers to both sides of a solid sheet of epoxy. Photoresist material is then applied to the copper layers. The photoresist coated sides are then exposed to ultraviolet light through a negative of the grid pattern. The light strikes the photoresist coatings in the areas corresponding to the solid portions of the grid 18, while the light is blocked from the areas corresponding to the open portions of the grid 18. The layered structure is then treated with a chemical etchant, such as a phenol and/or a hydrofluoric acid solution, that dissolves the two copper layers and the intermediate epoxy layer through the light unexposed regions while the light exposed regions remain intact. The protective photoresist is then removed from the remaining copper layers and the latter are dissolved by chemical etching. The etching rate of the copper is higher than that of the epoxy so that the copper can be removed readily with a minimum of removal of the epoxy material from the grid structure.

The grid 18 may also be made of aluminum that is anodized, to render the surfaces thereof insulating, after the grid 18 is formed by a photoetching method.

A rectangular, thin-metal conductive connector 26 is disposed in each of the rectangular openings 20 of the grid 18. The connectors 26 are bonded to the circular conductive dots 16, as by means of a solder layer 28. The connectors 26 may be made of thin sheet copper provided with a silver flash or a gold plating, and are tinned with solder on both sides. As will be seen, the conductive dots 16 and rectangular connectors 26 serve as means for physically attaching the solar cell array to the substrate formed by the mounting plate 12 and the insulating sheet 14, and also as means for making electrical connections between individual solar cells. For effecting electrical interconnection between adjacent solar cells, the rectangular connectors 26 are provided with a pair of spaced fingers 30 that overlie the bars of the grid 18.

Figure 6:
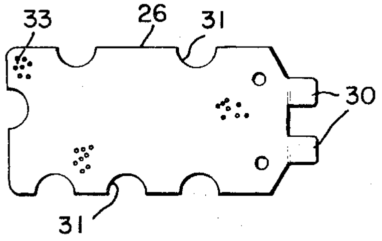
FIG. 6 is an enlarged plan view of a conductive connector forming a part of the assembly of FIG. 1.
Figure 7:
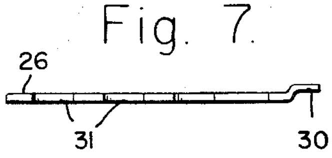
FIG. 7 is a sectional view of the connector of FIG. 6.

The details of a connector 26 are shown in FIGS. 6 and 7. The connector 26 there shown is formed with a number of cutouts 31 along the edges thereof, and the body of the connector is formed with a multiplicity of perforations 33. The cutouts 31 serve to collect any excess solder which flows over the surfaces of the connector 26 during soldering of the assembly 10. The perforations 33 serve to reduce the mass of the connector 26 so as to minimize its thermal expansion and contraction during the soldering process. The perforations 33 also provide a ready flow path for the liquid solder between the conductive dot 16 on one side of the connector 26 and the solar cell, yet to be described, on the other side of the connector 26, and thereby additionally insure a physical and electrical bond to the conductive dot 16 and solar cell.

An array of solar cells 32 are disposed in the grid openings 20 with their bottom surfaces firmly attached to the rectangular connectors 26 as by means of a solder layer 34. Referring to FIG. 8, which shows an enlarged veiw of one of the solar cells 32, the top or solar sensitive surface of each solar cell 32 is provided with spaced, parallel conductive lines 36. The conductive lines 36 collect the current generated by each solar cell 32 and transmit it to a conductive strip 38 disposed at one end of the lines 36.

Referring again to FIGS. 1 and 2, electrical series connections between adjacent solar cells 32 is made by soldering the fingers 30 of a conductive connector 26 located in a grid opening 20, to the conductive strip 38 of the solar cell 32 located in the horizontally adjacent grid opening 20. In each grid opening 20, the conductive fingers 30 are aligned with the spaces between the conductive lines 36 so as to avoid short circuiting of the solar cell in that opening. In furtherance of this end, the fingers 30 are designed to have a width less than the spacing between the conductive lines 36.

The solar cells 32 may be of a conventional kind consisting of N and P semiconductive material. In the kind known as N on P, the top layer is N type semiconductive material and the bottom layer is P type semiconductive material. In the type known as P on N, the positions of the layers are reversed. For purposes of discussion, it will be assumed that all of the solar cells 32 are of the N on P type. In this type, the top of the N side is the negative potential side and the bottom of the P side is the positive potential side of the solar cell 32. Thus, the conductive strips 38 serve as the negative contacts of the cells 32 and the solder layers 34 connecting the base of the cell to the conductive connector 26 serve as the positive contact.

In addition to being connected in series with each other, the solar cells 32 of a given row are connected in series with the cells 32 of adjacent rows in zig-zag fashion. To this end the conductive dots 16 at one end of each row are provided with laterally extending conductors, such as at 40 and 42. For example, the lateral conductor 40, connected to the conductive dot 16 located at the right end of the fourth row from the top of the array, terminates at a location adjacent to the right end of the third row. A jumper wire 44 connects the lateral conductor 40 to the conductive strip 38 on the solar cell 32 located at the right end of the third row, thereby connecting the third and fourth row of solar cells 32 in series. Similarly, the lateral conductor 42 and jumper wire 46, running between the left ends of the fourth and fifth rows, connect the solar cells 32 in these rows together.

As will be seen by comparing FIGS. 4 and 5, cutouts are provided in the grid 18, which are of the same shape as the lateral conductors on the insulating sheet 14, in order to facilitate the jumper wire connections between the solar cells and the conductive dots 16.

Referring again to FIG. 1, it will be noted that at conductive dot locations where lateral conductors are provided, the fingers 30 have been omitted from the rectangular conductive connectors 26, inasmuch as the lateral conductors and jumper wires provide the solar cell interconnecting function.

In the foregoing manner, certain rows of solar cells 32 to the array are connected in a series group. Provision is also made for connecting the solar cells 32 in a number of series groups and for connecting the series groups electrically in parallel. Such an arrangement proves advantageous when, during actual flight of a satellite, the antenna or other protruding structure casts a shadow on some of the solar cells. At such times, one series string of solar cells 32 may become inoperative without affecting the operations of the other series strings.

In the particular example shown, the solar cells 32 are arranged in three series groups of 34 solar cells each. Starting from the uppermost left hand corner of the array of FIG. 1, and reading from left to right, a positive terminal 48 connects to the first solar cell. Tracing through the first series group in zig-zag fashion in the direction of the arrows 50, it is seen that the cells are interconnected negative to positive. The first group of 34 cells terminates in the seventh row at the fifth cell. At the fifth cell location, the conductive strip 38, or negative contact, is connected by a jumper wire 52 to a negative terminal 54. The negative terminal 54 is shown as a small conductive dot on the insulating sheet 14 that is exposed through a small hole 56 in the grid 18.

Thus, the first group of solar cells 32 are connected in series between the terminals 48 and 54.

Now tracing the second group of solar cells 32, it is seen that a jumper wire 58 connects the negative terminal 54 to the conductive strip 38 on the sixth solar cell 32. Moving to the right and than zig-zagging through this group of 34 solar cells, in the direction of the arrows 50, it is seen that the cells in this group are interconnected positive to negative. The second group terminates, reading from left to right, at the seventh solar cell in the eleventh row.

Now it is seen that the seventh and eighth cells 32 of the eleventh row have their positive sides connected together through a strip conductor 60 joining the conductor dots 16 of those cells respectively. A portion of the strip conductor 60 is exposed through a small hole 62 in the grid 18 so as to provide a positive terminal common to the second and third groups of cells.

Thus, it is seen that the second group of cells 32 are connected in series between the terminals 54 and 60.

In similar fashion, starting with the eighth cell in the eleventh row and moving in the direction of the arrows 50, it is seen that the cells 32 in this group are interconnected negative to positive. The third group of cells 32 terminates, reading from left to right, in the first cell 32 of the last row. At the last cell location a jumper wire 64 connects the conductive strip 38 of the last cell to a small conductive dot or negative terminal 66 lying on the insulating sheet 14 and exposed through a small hole 68 in the grid 18.

Thus the third group of cells 32 are connected in series between the terminals 60 and 66.

The three groups of cells 32 may be connected in parallel by connecting the positive terminals 48 and 60 to one side of a load, not shown, and the negative terminals 54 and 66 to the other side of the load.

In fabricating the solar cell assembly 10, the mounting plate 12, electrically insulating sheet 14, and grid 18 are joined together in a unitary structure by means of epoxy cement, the circular dots 16 and other conductive elements on the insulating sheet 14 having first been pretinned with solder. The conductive connectors 26 are pretinned over their entirety and the solar cells 32 are pretinned on their lower surfaces.

The pretinned conductive connectors 26 and solar cells 32 are then assembled within the grid 18, the latter serving as a frame or jig for fixing the solar cells 32 in a desired pattern.

A thin sheet of pliable, heat resistant material, such as Teflon, is placed over the solar cells 32, followed by a pad of resilient material, such as polyurethane foam. A rigid pressure plate or weight is placed on the foam pad and the entire assembly is placed in a soldering oven maintained at a temperature sufficient to solder the pretinned parts. An oven temperature of above 290° F. and a heating time of about 10 minutes has been found satisfactory to effect the solder bonds without suffering significant deterioration of the solar cells.

When the assembly is removed from the oven, the fingers 30 of the conductive connectors 26 are soldered to the individual conductive strips 38 of the solar cells 32, and the various jumper wire connections are soldered individually, to complete the solar cell assembly 10.

The grid 18, which serves as a locating jig during the manufacturing process, may remain as an integral part of the finished assembly. When made of relatively lightweight, rigid material, the grid 18 will provide the structure with strength supplementing that of the mounting plate 12. The weight of the mounting plate 12 can thus be reduced.

Alternatively, the grid 18 can be made of a material that, after the soldering process has been completed, can be dissolved chemically without dissolving or otherwise injuring the other parts of the solar cell assembly 10. For this purpose, any one of a number of solvent susceptible polymeric materials, such as cellulose acetate/butyrate, poly-formaldehyde, poly(bisphenol-A carbonate), to mention a few, may be used for the grid 18. Examples of suitable solvents for these grid materials are acetone or methyl-ethyl-ketone. In such case, the weight of the solar cell assembly 10 can be reduced and a possible source of solar cell shadowing can be eliminated.

To fabricate a grid 18 of chemically soluble material, one may first produce a mold, as for example, by photoetching copper from an epoxy board. One may then apply the grid forming material, either in monomeric or polymeric form, to the mold. The grid forming material may then be treated by any of the well-known processing techniques to obtain the desired grid structure.

While the openings 20 in the grid 18 have been shown as accommodating a single solar cell, it may prove desirable to size the openings to accommodate two or more solar cells lying side by side on a single conductive connector which connects these cells in parallel. Referring to FIG. 9, for example, the grid **18*a* is provided with large openings 20*a*, each of which accommodates three solar cells 32. Each group of three solar cells 32 are fixed to a large conductive connector 26*a* having a surface extent the same as that of the three solar cells 32. The conductive connector 26*a* is provided with three pairs of fingers 30*a* which connect to a group of three solar cells 32, with one pair of fingers 30*a* connected to a respective solar cell 32**.

While the solar cell assembly 10 of FIG. 1 is shown as having a triangular shape, it may of course take other plane geometric configuration. The triangular assembly 10 shown may constitute one face of a tetrahedral satellite, with the other three faces having a similar triangular shape and a similar or different arrangement of solar cells.

The embodiments of the invention in which an exclusive property or privilege is claimed are defined as follows:

1. A solar cell assembly, comprising:

a substrate having an insulation surface;

a grid of electrically insulating material adhesively bonded to said insulating surface and provided with an array of openings therein;

an array of conductive dots adhesively bonded to said insulating surface in register with said grid openings;

a multiplicity of solar cells arranged within and substantially filling said array of openings;

means conductively and adhesively joining said solar cells individually to said conductive dots; and electrical connection means electrically connecting at least a plurality of said solar cells in circuit with each other.

2. The invention according to claim 1, wherein said grid is made of material that is soluble in a solvent to which said substrate, said solar cells, and said electrical connection means are inert.

3. The invention according to claim 2, wherein said grid is made of a material selected from the class consisting of cellulose acetate/butyrate, poly-formaldehyde, and poly(bisphenol-A carbonate).

4. The invention according to claim 1, wherein said means joining said solar cells and said dots comprises a thin metal conductive connector disposed within each of said grid openings, with said connector conductively and adhesively joined on one side to one of said conductive dots and on the other side to the base of one of said solar cells.

5. The invention according to claim 4, wherein said electrical connection means comprises means conductively connecting a conductive connector located in a grid opening with the solar sensitive surface of a solar cell located in a next adjacent grid opening.

6. The invention according to claim 5, wherein the solar sensitive surface of each of said solar cells is provided with spaced conductive lines, and wherein the conductive connector located in a grid opening is formed with a pair of spaced fingers that overlie and connect the conductive lines of the solar cell in the next adjacent grid opening.

References Cited

UNITED STATES PATENTS

| | | | |
|---|---|---|---|
| 2,962,539 | 11/1960 | Daniel | 136—89 |
| 3,268,366 | 8/1966 | Guyot | 136—89 |
| 3,330,700 | 7/1967 | Golub et al. | 136—89 |
| 3,375,141 | 3/1968 | Julius | 136—89 |
| 3,346,419 | 10/1967 | Webb | 136—89 |
| 3,376,164 | 4/1968 | Bachwansky | 136—89 |
| 3,378,407 | 4/1968 | Keys | 136—89 |

ALLEN B. CURTIS, Primary Examiner

U.S. Cl. X.R.

29—571